(12) United States Patent
Tilke et al.

(10) Patent No.: US 7,005,723 B2
(45) Date of Patent: Feb. 28, 2006

(54) BIPOLAR TRANSISTOR AND METHOD OF PRODUCING SAME

(75) Inventors: Armin Tilke, München (DE); Kristin Schupke, Dresden (DE)

(73) Assignee: Infineon Technologies AG, Munich (DE)

( * ) Notice: Subject to any disclaimer, the term of this patent is extended or adjusted under 35 U.S.C. 154(b) by 23 days.

(21) Appl. No.: 10/764,264

(22) Filed: Jan. 23, 2004

(65) Prior Publication Data
US 2004/0212045 A1    Oct. 28, 2004

(30) Foreign Application Priority Data
Jan. 23, 2003   (DE) ................. 103 02 625

(51) Int. Cl.
*H01L 27/082*    (2006.01)

(52) U.S. Cl. ............ 257/578; 257/587; 257/584; 257/586; 438/348

(58) Field of Classification Search ........... 257/587, 257/578, 584, 586, 588, 592, E21.371, E21.379, 257/E29.044, E29.184; 438/343, 348, 350
See application file for complete search history.

(56) References Cited

U.S. PATENT DOCUMENTS 5,523,245 A * 6/1996 Imai .................. 438/366
6,319,786 B1 11/2001 Gris

FOREIGN PATENT DOCUMENTS

WO     WO 01/63644 A2    8/2001

* cited by examiner

*Primary Examiner*—Nathan J. Flynn
*Assistant Examiner*—Scott R. Wilson
(74) *Attorney, Agent, or Firm*—Maginot, Moore & Beck

(57) ABSTRACT

In a method of producing a bipolar transistor, a semiconductor substrate having a substrate surface is provided. A base-terminal layer for providing a base terminal is formed on the substrate surface, and an emitter window having a wall area is formed in the base-terminal layer. A first spacing layer is formed on the wall area of the emitter contact window, and a recess is etched into the substrate within a window specified by the first spacing layer. A base layer contacted by outdiffusion from the base-terminal layer is formed in the recess of the emitter window, and a second spacing layer is formed on the first spacing layer and on the base layer. The second spacing layer is structured for the purpose of specifying a planar terminal pad on the base layer, and an emitter layer is formed on the planar terminal pad.

17 Claims, 7 Drawing Sheets

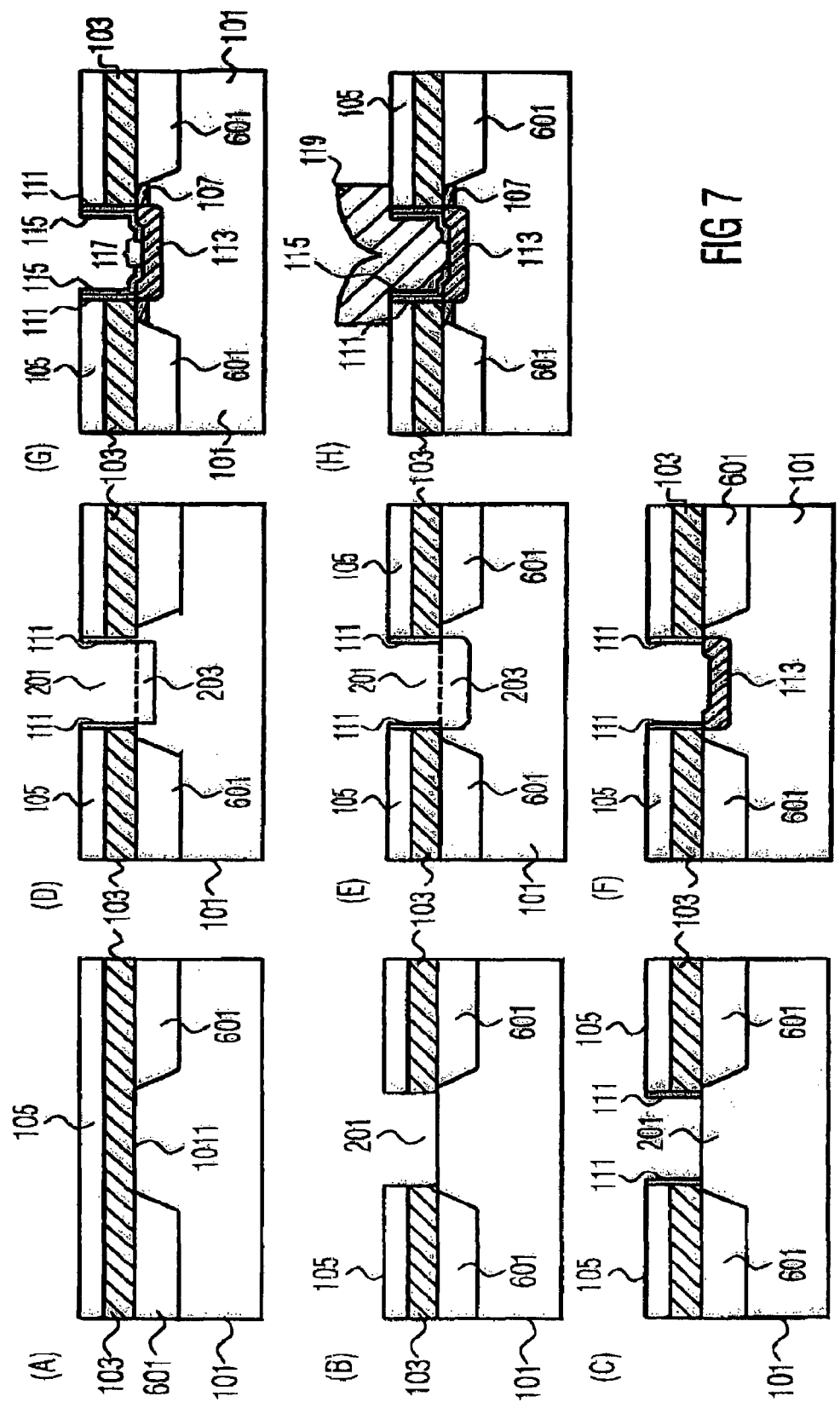

BIPOLAR TRANSISTOR AND METHOD OF PRODUCING SAME

BACKGROUND OF THE INVENTION

1. Field of the Invention

The present invention relates to a bipolar transistor as well as to a method of producing the bipolar transistor, the transistor having an epitaxial base in a substrate.

2. Description of Prior Art

As the integration density of modern microelectronic circuits increases, it is necessary for the integrated devices, i.e. bipolar transistors, to have small dimensions as well as good electrical properties, so that the integrated circuits take up little space and operate with as little loss as possible. As information rates are on the increase, it is important, in addition, for the integrated devices to have a good high-frequency performance, which may be achieved, for example, by reducing the parasitic effects by reducing the extrinsic base resistance of a bipolar transistor or by reducing its base-collector capacitance.

For producing a conventional double-polysilicon bipolar transistor having an epitaxed base, a base layer (base) is deposited, usually in an epitaxially selective manner, on a semiconductor substrate, for example a silicon substrate. To deposit the base in an emitter window of a bipolar transistor and, at the same time, to obtain a self-adjusted connection to a highly conductive base-terminal polysilicon required for contacting the base, a sacrificial layer between the substrate and the base-terminal polysilicon in the emitter window is often undercut in etching, since the deposition of a base grown in a selectively epitaxial manner in a double-polysilicon bipolar process usually requires the presence of the sacrificial layer above the silicon substrate in an area of the emitter window. In order to use this double-polysilicon concept for epitaxed transistors, a selective deposition is further required which grows only on silicon surfaces. By undercutting the base-terminal polysilicon, the base may epitaxially grow on the substrate surface, the thus defined epitaxial base (e.g. silicon germanium, SiGe) also growing on the highly doped base-terminal polysilicon from below (in principle, other materials are also suitable, and, in particular, silicon (without germanium) has already been employed). This results in a self-adjusted base terminal. However, a problem here is that the (e.g.) SiGe which is growing on the polysilicon from below, is polycrystalline and will at some point butt against the epitaxial SiGe growing on the silicon substrate, whereby an interface of these two layers is formed, which interface may lead to problems regarding a reproducibility of a bipolar transistor as well as with regard to a stability of same. In addition, epitaxed bases are almost exclusively used as SiGe epitaxy. Since the SiGe base grows on the terminal polysilicon in a polycrystalline manner and grows on the silicon substrate in a crystalline manner, the interface of the SiGe polysilicon with the epitaxial SiGe will lead to further problems, such as a poor reproducibility of the electrical parameters of a bipolar transistor thus produced, and thus, for example, to poor matching properties. In principle, however, other materials are also suitable, and, in particular, silicon (without germanium) has already been employed.

The presence of the relatively thick sacrificial layer (70–150 nm) further leads to a very high emitter stack which is processed-induced. In particular in modern BiCMOS technologies, the high emitter stack leads to planarization problems before a via hole is etched, which, in addition, sets process-induced limits to a further reduction of dimensions of such a bipolar transistor. A further disadvantage of such an approach for producing a bipolar transistor is the fact that the formation of the sacrificial layer required leads to the manufacturing process becoming more expensive.

The dimensions of a bipolar transistor may be reduced if the sacrificial layer is not formed in a manufacturing process. In WO01/63644 A2, an emitter via hole is etched through a highly doped implanted substrate layer. A base layer is produced in the emitter via hole. However, the base-collector capacitance produced with this method is high, which leads to a deterioration of the high-frequency performance of the bipolar transistor. Another disadvantage in the bipolar transistor disclosed in the above-mentioned document is that, in the manufacturing process, a platform collector needs to be produced by means of an implantation, which is why the manufacturing costs go up.

SUMMARY OF THE INVENTION

It is the object of the present invention to provide a bipolar transistor having good electrical properties and small dimensions.

In accordance with a first aspect, the invention provides a method of producing a bipolar transistor, the method including the following steps: providing a semiconductor substrate having a substrate surface; forming a base-terminal layer on the substrate surface for providing a base terminal; forming an emitter window, comprising a wall area, in the base-terminal layer; forming a first spacing layer on the wall area of the emitter window; etching a recess in the semiconductor substrate within a window specified by the first spacing layer; forming a base layer in the recess of the emitter window; forming a second spacing layer on the first spacing layer and on the base layer: structuring the second spacing layer for the purpose of specifying a planar terminal pad on the base layer; forming an emitter layer on the planar terminal pad.

In accordance with a second aspect, the invention provides a bipolar transistor, having: a semiconductor substrate; a base-terminal layer arranged on the semiconductor substrate; a further recess extending through the base-terminal layer into the semiconductor substrate; a first spacing layer arranged on walls of the further recess; a base layer arranged in the further recess; a second spacing layer which is arranged on the first spacing layer and the base layer and specifies a planar terminal pad on the base layer; an emitter layer arranged on the planar terminal pad.

The present invention is based on the findings that the base layer may be epitaxially deposited in a recess which is etched into the semiconductor substrate and may reach, for examples as far as underneath the base-terminal layer, for example.

An advantage of the present invention is that a polycrystalline/monocrystalline boundary layer within the base which is epitaxed in accordance with the invention is avoided, whereby more process stability is achieved. In addition, an improvement in the reproducibility of the electrical parameters is thereby achieved, whereby further a defined specification of the electrical properties of the inventive bipolar transistor is achieved.

A further advantage of the present invention is the fact that the epitaxial base is preferably buried in a silicon substrate, and, in addition, is for example deposited into a trench which has been formed in the substrate by wet-chemical etching. Thereby, the height of the emitter stack may be reduced by about 100 nm, and at the same time it may be achieved that the SiGe base only grows on crystalline silicon areas, which does away with the interface of the SiGe polysilicon with the epitaxial SiGe. Thereby, a reduction of the dimensions of the inventive bipolar transistor is achieved. At the same time, the boundary layer, which has already been mentioned, is avoided, so that the achievement of the above-mentioned advantages does not entail any increase in the manufacturing costs, but even a reduction of same. It shall be noted at this point that the epitaxed base need not necessarily be SiGe, as has already been mentioned.

A further advantage of the present invention is that the inventive bipolar transistor may be integrated in a simplified manner into highly integrated BiCMOS processes, which further reduces manufacturing costs.

Yet another advantage of the present invention is that the inventive bipolar transistor may preferably be realized in already existing or future bipolar/BiCMOS technologies, which is why no additional technology process need to be developed or used for the production of same, which leads to a further reduction of manufacturing costs.

BRIEF DESCRIPTION OF THE DRAWINGS

Preferred embodiments of the present invention will be explained below in detail with reference to the accompanying figures, wherein:

FIG. 7 shows yet another embodiment of a method of producing a bipolar transistor in accordance with the present invention.

DESCRIPTION OF PREFERRED EMBODIMENTS

Figure 1:
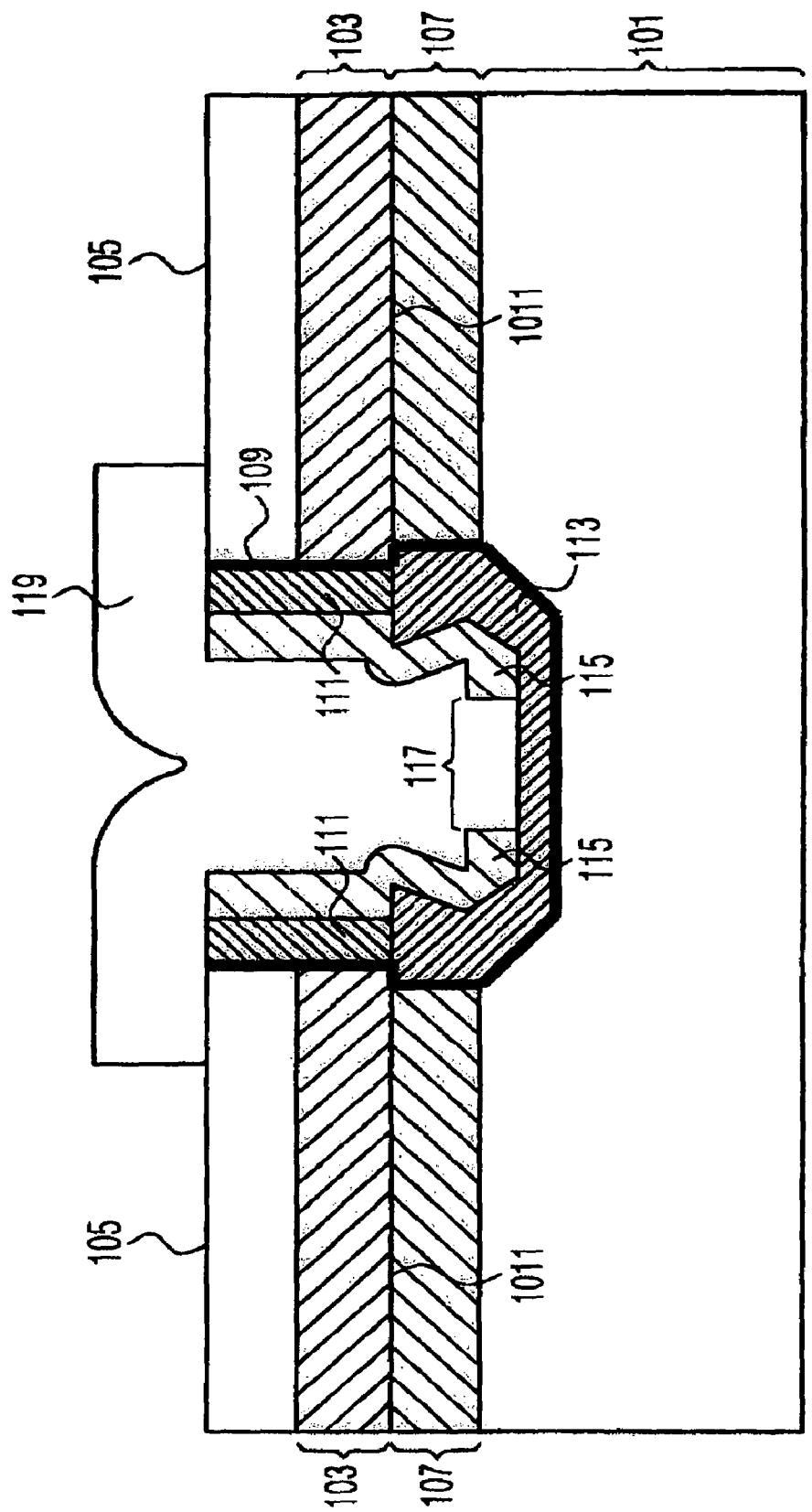
FIG. 1 shows a bipolar transistor in accordance with an embodiment of the present invention.

FIG. 1 shows an embodiment of a bipolar transistor in accordance with the present invention. The bipolar transistor comprises a semiconductor substrate 101 including a substrate surface 1011. A base-terminal layer 103 is arranged on the substrate surface 1011. In this embodiment, an isolation layer 105 is arranged on the base-terminal layer 103. The substrate surface 1011 further forms an upper boundary for a diffusion layer 107 extending into the semiconductor substrate 101 and bordering on the base-terminal layer 103. The bipolar transistor shown in FIG. 1 further comprises a further recess 109 extending through the base-terminal layer 103 into the substrate 101. Due to the isolation layer 105 and the diffusion layer 107 present in this embodiment, the further recess 109 extends both through the isolation layer 105 and through the diffusion layer 107. A first spacing layer 111, which laterally terminates the base-terminal layer 103, in each case, is arranged on the walls of the further recess 109. The first spacing layer 111 is configured such that it laterally terminates the isolation layer 105 as well. In the further recess 109, a base layer 113 is arranged in an area of the further recess 109, which area does not comprise the first spacing layer 111. A second spacing layer 115 specifying a planar terminal pad 117 is configured on the first spacing layer 111 as well as on the base layer 113. The planar terminal pad 117 is configured such that it does leaves a certain area of the base layer 113 uncovered. An emitter layer 119 which is configured such that it fills an area of the recess 109 which is bounded by the second spacing layer 115 is arranged on the planar terminal pad 117.

A structure of the inventive bipolar transistor shown in FIG. 1 will be explained in detail below, reference being made below to an npn bipolar transistor. However, it shall be noted at this point that the following descriptions and embodiments also apply to pnp bipolar transistors if the respective doping is switched.

The semiconductor substrate 101 may be, for example, a monocrystalline silicon substrate comprising an n-doping. However, the substrate 101 may also be a p-silicon substrate on which is grown a thick (0.3–1 $\mu$m) n epitaxy. This means that there is n silicon underneath the base, but on p substrate. This structure serves to isolate the collectors (pn isolation).

The doping may be homogenous in the entire semiconductor substrate 101, or it follows, for example, a doping gradient, so that the semiconductor substrate 101 comprises areas with differing dopant concentrations. In this embodiment, semiconductor substrate 101 forms a collector of the inventive bipolar transistor. The base layer 113 is, e.g., p-doped SiGe which is arranged in such a manner in the further recess 109 that it does not touch the base-terminal layer 103 which may be, for example, highly p-doped polysilicon. A separation of the base layer 113 from the base-terminal layer 103 is achieved by the first spacing layer 111 which, being located on the walls of the further recess 109, laterally seals the base-terminal layer. Since the base-terminal layer 103 and the base layer 113 do not touch each other, no polycrystalline boundary layer may form between the base layer 113 and the base-terminal layer 103, so that the problems which have been mentioned above in this context do not occur in the inventive bipolar transistor.

Usually, a p-silicon substrate is used, on which a thick (0.3–1 nm) n epitaxy is grown. This means that, actually, there is n silicon underneath the base, but on p substrate-This structure serves to isolate the collectors (pn isolation).

In accordance with the embodiment shown in FIG. 1, base layer 113 is buried in the semiconductor substrate 101 without there being an intermediate layer introduced between the semiconductor substrate 101 and the base layer 113. The second spacing layer 115 is arranged in such a manner on the first spacing layer and on the base layer that a planar terminal pad is specified on the base layer 113, so that the emitter layer is connected to the base layer in a defined area which is defined by the planar terminal pad 117. The emitter layer 119 is configured, for example, as an n-doped poly- or monosilicon, and, in this embodiment, fills the recess. The isolation layer 105 arranged on the base-terminal layer 103 here prevents the emitter layer 119 from touching the base-terminal layer 103. In the embodiment shown in FIG. 1, for conductively connecting the base-terminal layer with the base layer, the diffusion layer 107 is configured, so that a conductive connection is created by means of the diffusion layer 107. The diffusion layer 107 is formed by a dopant diffused out of the, for example, p-doped base-terminal layer 103, which may be realized, for example, by thermal processing of the bipolar transistor. Since no polycrystalline boundary layer is formed between the base layer 113 and the base-terminal layer 103, and since the one conductive connection between the base layer 113 and the base-terminal layer 103 has been established by means of the diffusion layer 107, transition resistance between the base layer 113 and the base-terminal layer 103 is small. In addition, a base collector capacitance is also small, since the base-terminal layer 103 lies, for the most part, on the shallow trench isolation (STI).

If, for example, the second spacing layer 115 is produced from an oxide or nitride, an diffusion of the dopant out of the base-terminal layer 103, for example into the emitter layer 119, may be prevented.

The spacer 111 primarily serves to prevent the selective epitaxy from growing on the base-terminal polysilicon laterally as well. In a conventional double-poly process, this spacer may even be removed again after the epitaxy. The actual isolation of base-poly and emitter-poly is then performed by the L-shaped spacer 115.

If, for example, the base-poly is wet-chemically undercut, a step is formed between the terminal-poly and in the substrate (e.g. silicon substrate), and the window is broader in the substrate, as is indicated in FIG. 1.

Figure 2:
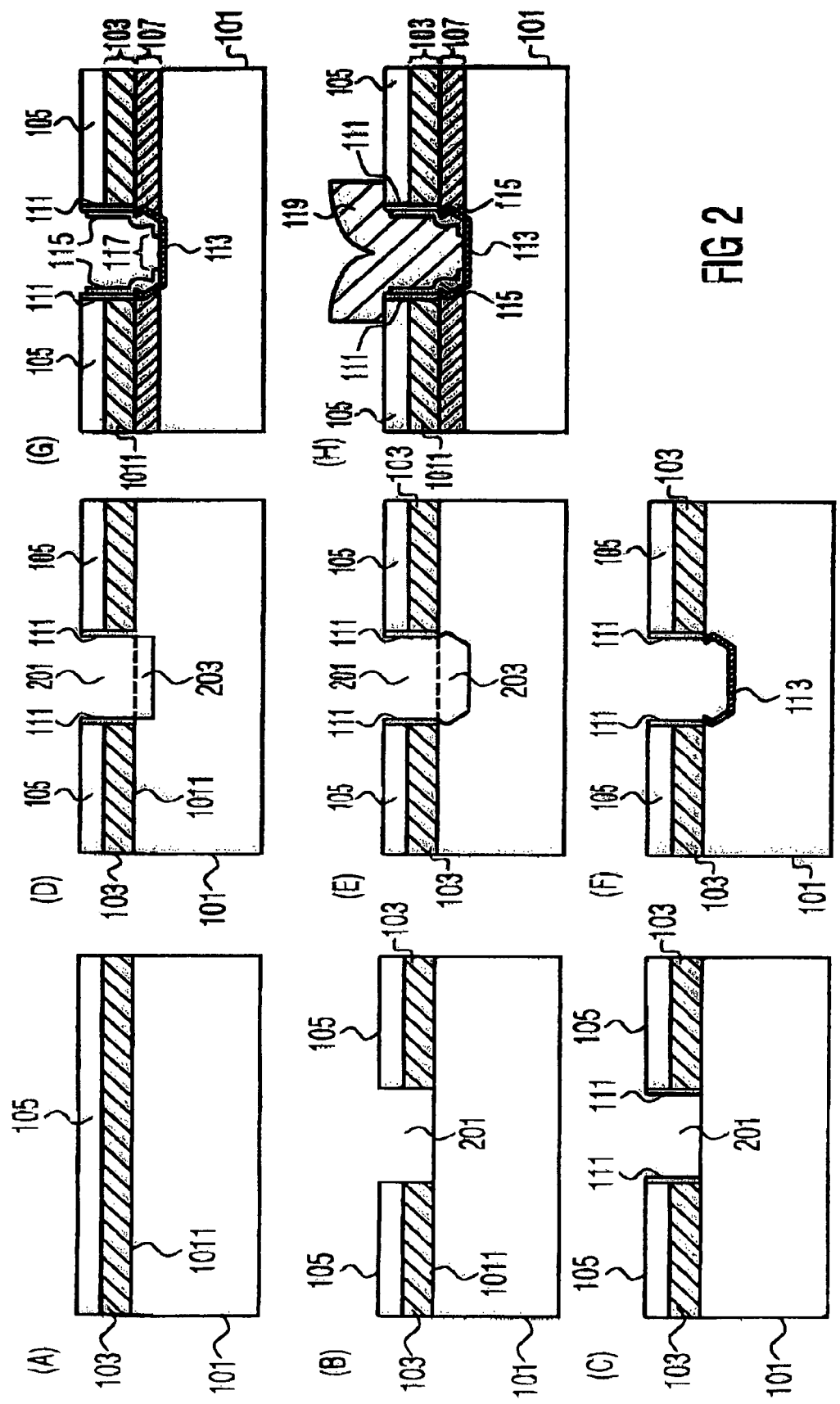
FIG. 2 shows an embodiment of a method of producing a bipolar transistor in accordance with the present invention.

FIG. 2 shows an embodiment of a method of producing a bipolar transistor in accordance with the present invention. Here, a diagrammatic process flow of a double-silicon bipolar technology having an epitaxial base and using an anisotropic Si etching is shown. The individual steps of the inventive method are illustrated by FIG. 2a–2f.

FIG. 2a shows the first steps of the inventive method. Initially, the semiconductor substrate 101 is provided, on whose surface 1011 the, e.g., highly doped base-terminal layer 103 (polysilicon layer, base-terminal poly) is deposited. In addition, the isolation layer 105, which, for example, consists of $SiO_2$, is deposited on the base-terminal layer 103. Thereafter, an emitter window 201 is etched through the isolation layer 105 and through the base-terminal layer 103, as is shown in FIG. 2b. The emitter window 201 thus formed is thus also formed in the base-terminal layer 103 and extends to the substrate 101, the emitter window 201 laterally comprising a wall area. In a further process step, which is illustrated in FIG. 2c, the first spacing layer 111 (internal spacer) is formed on the wall area of the emitter window 201, for example by depositing and etching. In a further process step, illustrated in FIG. 2d, a recess 203 is etched, for example by anisotropic dry-etching, into the silicon substrate 101 within a window specified by the first spacing layer. In accordance with the embodiment shown in FIG. 2, recess 203 is etched by means of wet-etching, which may be isotropic or anisotropic, in a step shown in FIG. 2e, so that the base-terminal layer 103 is undercut. Thereby, for example in a (100)-Si, a V-trench is defined which is forming inversely underneath the terminal polysilicon 103. In a further process step shown in FIG. 2f, the base layer 113 is formed in the recess 203 by epitaxial deposition with a selective epitaxy. Because of the first spacing layer 111, the base layer 113 is created such that no polycrystalline boundary layer is formed between the base layer 113 and the base-terminal layer 103 after the process step shown in FIG. 2f has been completed. In the process steps shown in FIG. 2g, the spacing layer 115 (second spacer) is formed on the first spacing layer 111 and on the base layer 113 by means of deposition. In a further step, the second spacing layer 115 is structured for specifying the planar terminal pad 117 on the base layer 113. For example, the diffusion layer 107 is formed by curing, for example using a temperature treatment, the highly p-doped polysilicon 103, for example after epitaxial deposition of the base layer 113 (epitaxy). By diffusing the dopant out of the base-terminal layer 103, a conductive connection between the base layer 113 and the base-terminal layer 103 is thus created. In a further process step, shown in FIG. 2h, the emitter layer 119 is formed on the planar terminal pad, the emitter layer 119 being formed, in the embodiment shown in FIG. 2, by depositing a polysilicon, such that the emitter layer 119 fills a space defined by the second spacing layer 115 as well as by the base layer 113. Here, the isolation layer 105 prevents the emitter layer thus produced from touching the base-terminal layer 103 which has been formed for providing a base terminal.

By preliminarily etching the substrate 101 in the area of the emitter window 201 without using a sacrificial layer between the substrate 101 and the base-terminal poly 103, the V-shaped undercutting underneath the terminal polysilicon 103, which V-shaped undercutting has already been mentioned, may be achieved by, for example, anisotropic wet-etching. The base 113 may now again be epitaxed on the thus defined, buried substrate surface as is defined by recess 203. If, for example, the highly p-doped terminal polysilicon 103 is not cured until after the epitaxy, the dopant contained in the terminal polysilicon 103 is driven into the silicon substrate 101 and, laterally, into the SiGe epitaxy (base layer 113). By means of this process control, an increase in the stack due to the sacrificial layer is avoided, on the one hand, and, on the other hand, a formation of the above-mentioned interfaces between SiGe poly and the epitaxial SiGe is prevented. Recess 203 and emitter window 201 further form the further recess 109 represented in FIG. 1.

Figure 3:
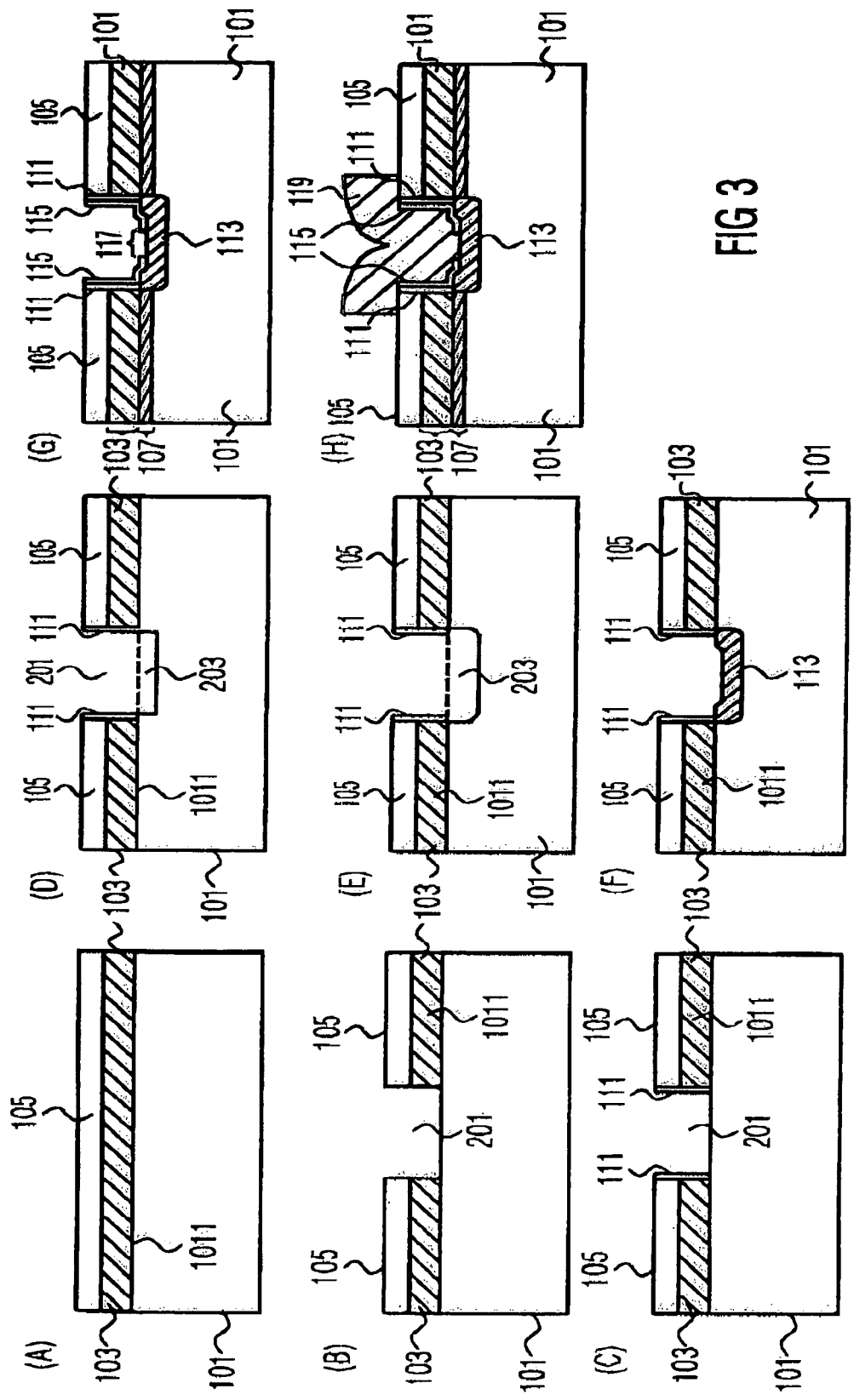
FIG. 3 shows a further embodiment of a method of producing a bipolar transistor in accordance with the present invention.

FIG. 3 shows a further embodiment of a method of producing a bipolar transistor in accordance with the present invention. Here, a schematic process flow of a double-polysilicon bipolar technology having an epitaxial base using an isotropic Si etching is shown. The individual steps of the inventive method are illustrated by FIG. 3a–3f.

Unlike the process steps shown in FIG. 2e, in the process step shown in FIG. 3e, the recess 203 is wet-chemically post-etched in an isotropic manner by wet-etching into the silicon substrate 101, no V-shaped undercutting underneath the terminal polysilicon 103 being formed in the process. In this method, however, the terminal polysilicon may be undercut in an isotropic manner. In a process step shown in FIG. 3f, in the recess 203 thus formed, the base 113 is formed by epitaxial deposition with a selective epitaxy. The presence of the first spacing layer 111 here prevents the epitaxy 113 from touching the terminal polysilicon 103. The epitaxy is thus fully buried in the monocrystalline silicon substrate 101, the base layer 113 being formed essentially in a vertical area defined by the walls of the emitter window 201. In a further step shown in FIG. 3g, the second spacing layer 115 is formed, for example by depositing and etching, on the first spacing layer 111 and on the base layer 113, the planar terminal pad 117 being exposed in a further process step. By curing the base-terminal layer 103, the diffusion layer 107 is formed, as has already been explained in the context of the embodiment shown in FIG. 2, so that the base-terminal layer 103 is conductively connected to the base layer 113. The first spacing layer 111 here prevents the formation of a further polycrystalline boundary layer which would lead to a deterioration of the properties of the bipolar transistor thus produced.

By analogy with anisotropic etching, wet-chemical post-etching may also be performed, after substrate etching, for example by means of dry-etching. Thereby, a smoothening of an emitter window bottom which has been thus dry-etched and is defined by the recess 203, is achieved, on which bottom the base 113 may then be epitaxed. This process step is performed without or with isotropic undercutting of the base-terminal polysilicon 103. In the isotropic silicon etching mentioned, the silicon is slightly upward-oxidized, for example by hot SC1 purification (H$_2$O/NH$_4$OH/H$_2$O$_2$) and is removed, for example, in a subsequent DHF dip. In the process, e.g. 3–4 nm of silicon are consumed. This sequence may be repeated any number of times until a desired amount of removal by etching has been achieved.

A bipolar transistor may preferably be produced, by a process flow for the purpose of creating a self-adjusted polyemitter bipolar transistor in a double-poly technology, by anisotropic undercutting of the base-terminal polysilicon. By analogy therewith, however, the epitaxial base may be buried into the substrate by a combination of anisotropic dry-etching and isotropic wet-etching, without undercutting the polysilicon.

Figure 4:
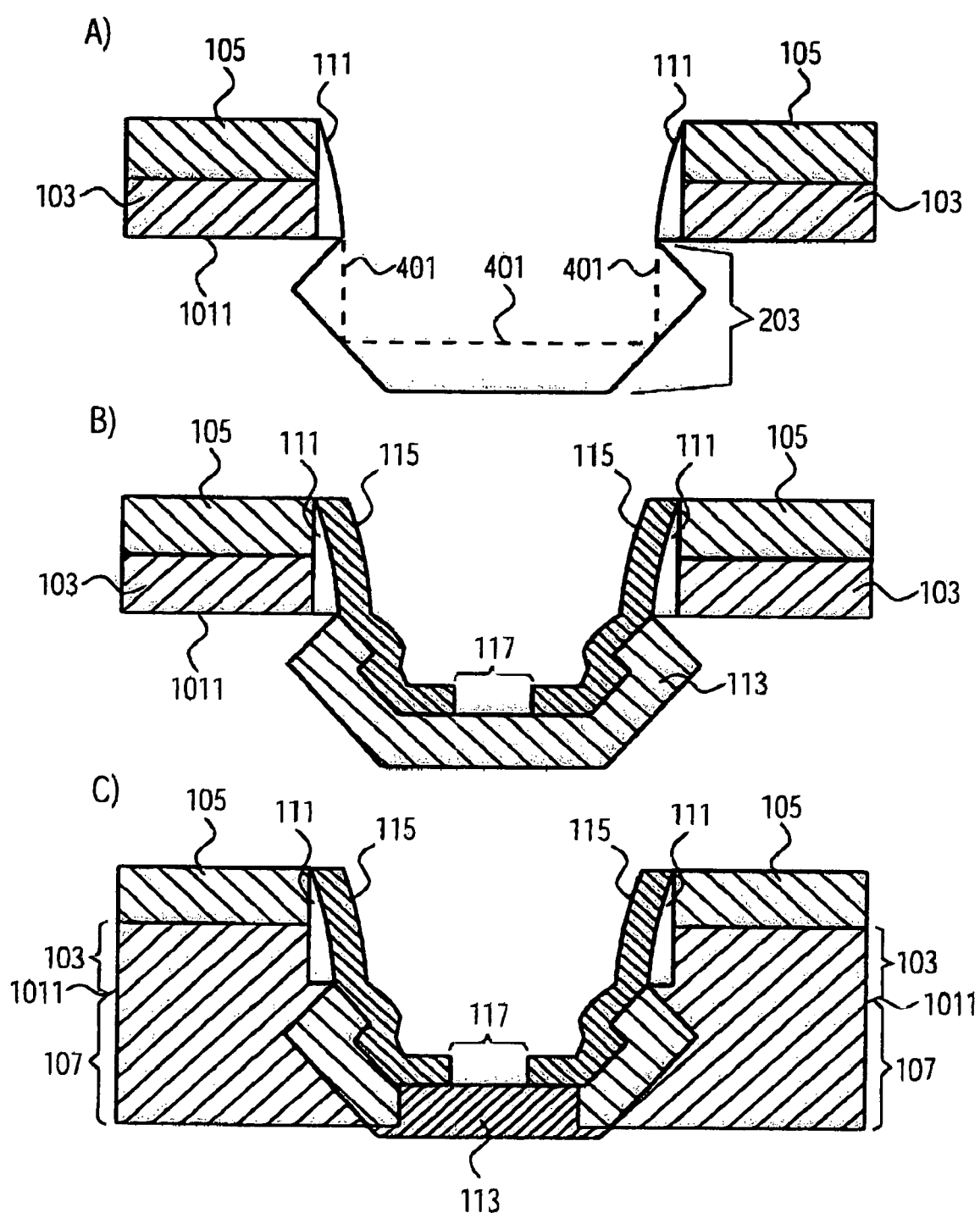
FIG. 4 shows yet another embodiment of a method of producing a bipolar transistor in accordance with the present invention.

FIG. 4 shows, in a magnification, three process steps that have already been discussed in the context of the embodiment shown in FIG. 2.

FIG. 4a corresponds to the process step shown in FIG. 2e, wherein anisotropic undercutting of the base-terminal layer 103 is configured. In a process step, dry-etching is initially performed which exposes an area limited by the etching edges 401. In a further step, an etching profile 403 is formed by the anisotropic undercutting. In the process steps shown in FIG. 4b, the base layer 113 (epitaxy, for example SiGe) and the second spacing layer 115 (internal spacer) are formed. It can clearly be seen in FIG. 4b that the base layer 113 does not touch the base-terminal layer 103 after the epitaxy due to the inventive first spacing layer 111.

FIG. 4c shows the step of outdiffusing the base polysilicon 103, whereby the diffusion layer 107 is produced. It can clearly be seen that the base layer 113 is conductively connected to the base-terminal layer with the aid, in accordance with the invention, of diffusion layer 107, without there forming a disruptive polycrystalline layer between the base layer 113 and the base-terminal layer 103.

Figure 5:
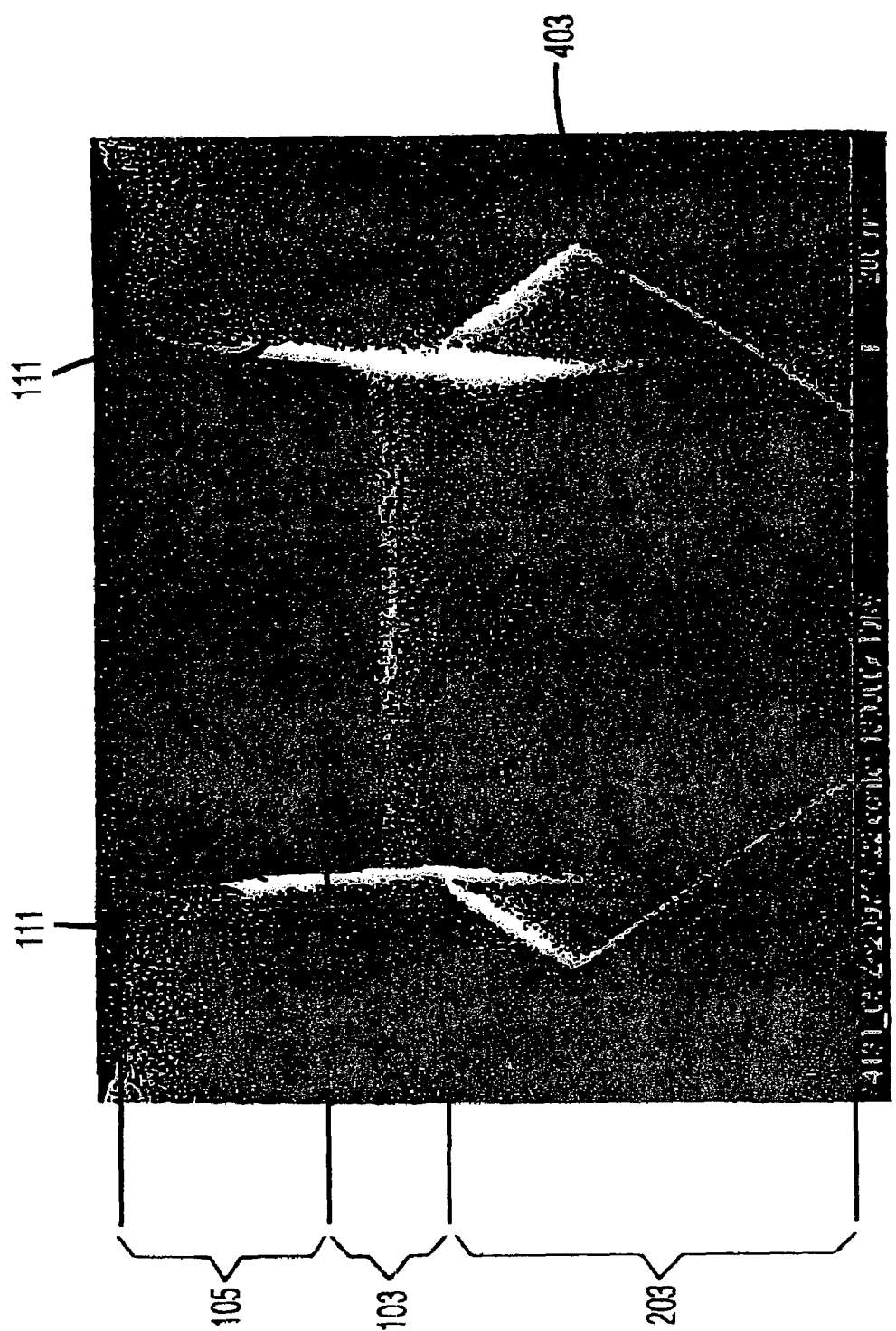
FIG. 5 shows a further embodiment of a bipolar transistor in accordance with the present invention.

FIG. 5 shows a picture of an etching profile after a long overcutting, as is obtained after the process steps shown in FIG. 4a, the internal spacer 115 not being formed. It can clearly be seen from the embodiment shown in FIG. 5 that the etching profile 403 desired may be precisely structured after long overcutting, so that the base layer 113 may be formed, in a subsequent process step, such that it does not touch the base-terminal layer 103.

Figure 6:
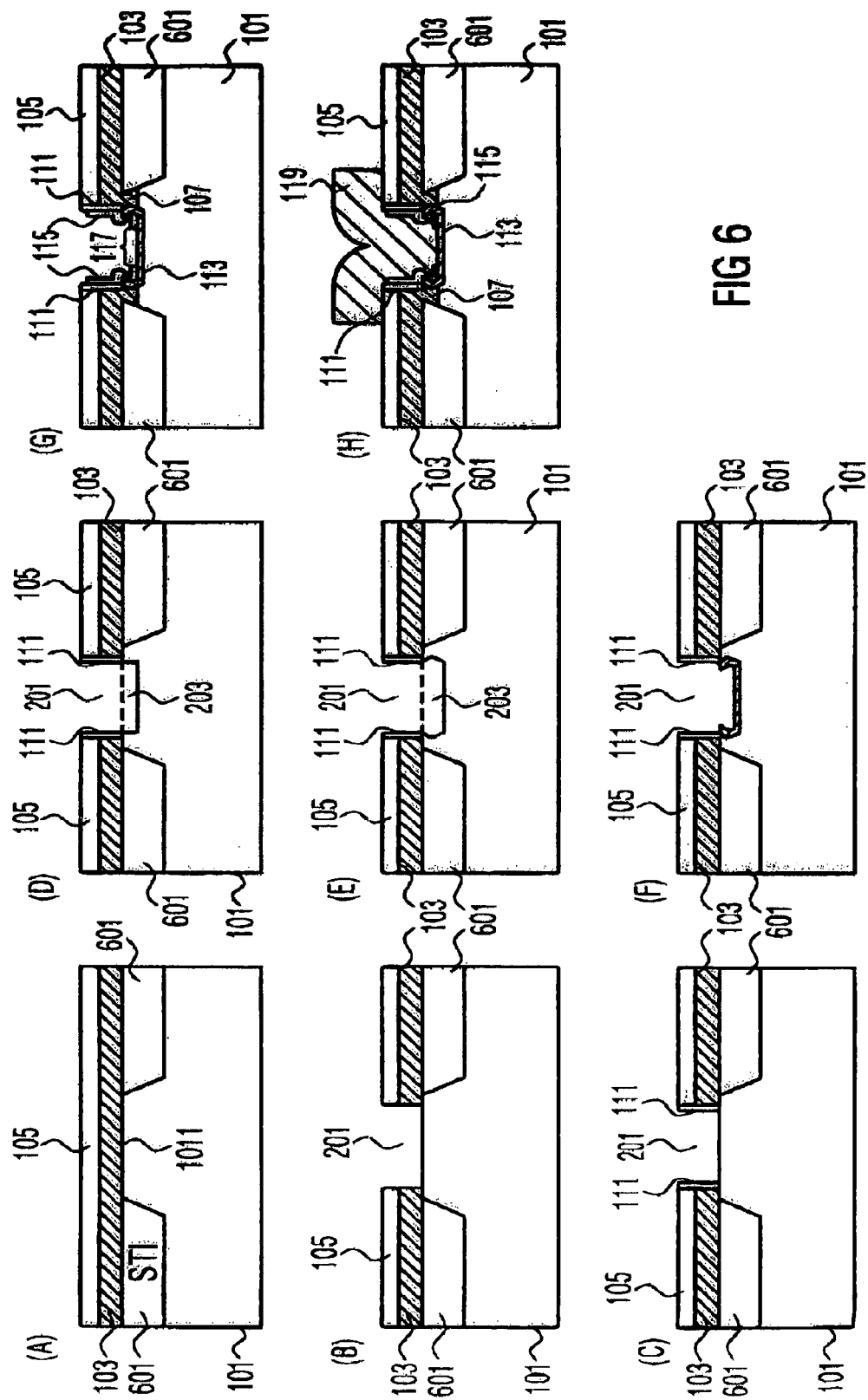
FIG. 6 shows yet another embodiment of a method of producing a bipolar transistor in accordance with the present invention.

FIG. 6 shows a further embodiment of a method of producing a bipolar transistor in accordance with the present invention. Unlike the process shown in FIG. 2, after the step of providing the semiconductor substrate (FIG. 6a), a shallow trench isolation (STI) 601 is formed before the base-terminal layer 103 is deposited. The STI 601 is configured such that it consists of two parts separated from one another by a substrate ridge.

The bipolar transistor shown in FIG. 6f thus comprises the STI 601, unlike the structure shown in FIG. 1.

FIG. 7 shows a further embodiment of a method of producing a bipolar transistor in accordance with the present invention. Unlike the process shown in FIG. 3, after the step of providing the semiconductor substrate (FIG. 7a), a shallow trench isolation (STI) 601 is formed before the base-terminal layer 103 is deposited. The STI 601 is configured such that it consists of two parts separated from one another by a substrate ridge.

The bipolar transistor shown in FIG. 6f thus comprises the STI 601, unlike the structure shown in FIG. 1.

Unlike WO01/63644 A2, a highly doping implantation into the substrate silicon is performed in accordance with the invention. Since sufficient space is required laterally for contacting the base at this highly doped area, this means that there is a very wide substrate surface. This leads to a high base-collector capacitance. If, in accordance with the invention, an epitaxed base is made to laterally abut on a base polysilicon, the substrate area (between the two STI isolation trenches which may be filled with oxide) may be kept very small, since the base-poly may also be deposited onto the STI oxide.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A method of producing a bipolar transistor, comprising:
providing a semiconductor substrate having a substrate surface;
forming a base-terminal layer on the substrate surface for providing a base terminal without a sacrificial layer therebetween;
forming an emitter window, comprising a wall area, in the base-terminal layer;
forming a first spacing layer on the wall area of the emitter window;
etching a recess in the semiconductor substrate within a window specified by the first spacing layer;
forming a base layer in the recess of the emitter window;
forming a second spacing layer on the first spacing layer and on the base layer;
structuring the second spacing layer for the purpose of specifying a planar terminal pad on the base layer;
forming an emitter layer on the planar terminal pad,
wherein a conductive connection between the base layer and the base-terminal layer is produced by diffusing a dopant out of the base-terminal layer into the semiconductor substrate.

2. The method as claimed in claim 1, wherein in the step of forming the first spacing layer, the wall area of the emitter window is fully covered, so that after the step of forming the base layer, the base-terminal layer does not touch the base layer.

3. The method as claimed in claim 1, wherein the first spacing layer is formed by means of deposition.

4. The method as claimed in claim 1, wherein the step of etching the recess includes a step of anisotropic dry-etching into the substrate.

5. The method as claimed in claim 4, wherein the step of etching the recess includes a further step of isotropic wet-etching performed after the step of the anisotropic dry-etching.

6. The method as claimed in claim 1, wherein the base layer is formed by selective epitaxial deposition.

7. The method as claimed in claim 1, wherein the step of forming the base layer includes a further step of forming an isolation layer on the base layer, the emitter window being formed in the base-terminal layer and in the isolation layer.

8. The method as claimed in claim 1, wherein the emitter layer is formed by depositing a poly- or monosilicon.

9. The method as claimed in claim 1, wherein the base-terminal layer is formed by depositing a doped polysilicon layer.

10. The method as claimed in claim 9, wherein said step of etching a recess in the semiconductor substrate comprises undercutting the base-terminal layer.

11. A bipolar transistors comprising:
a semiconductor substrate;
a base-terminal layer arranged on the semiconductor substrate without a sacrificial layer therebetween;
a further recess extending through the base-terminal layer into the semiconductor substrate;
a first spacing layer arranged on walls of the further recess;
a base layer arranged in the further recess;
a second spacing layer which is arranged on the first spacing layer and the base layer and specifies a planar terminal pad on the base layer;
an emitter layer arranged on the planar terminal pad,
wherein the base layer and the base-terminal layer are conductively connected essentially by means of a dopant diffused out of the base-terminal layer into the semiconductor substrate.

12. Bipolar transistor as claimed in claim 11, wherein the first spacing layer is formed to separate the base layer from the base-terminal layer in a wall area of the further recess.

13. The bipolar transistor as claimed in claim 11, wherein the base-terminal layer is a doped polysilicon.

14. The bipolar transistor as claimed in claim 11, wherein the further recess comprises an area which extends laterally under the base-terminal layer.

15. The bipolar transistor as claimed in claim 11, wherein the emitter layer comprises doped poly- or monosilicon.

16. The bipolar transistor as claimed in claim 11, wherein an isolation layer is arranged on the base-terminal layer, the emitter window extending through the isolation layer and through the base-terminal layer.

17. The bipolar transistor as claimed in claim 11, which comprises a shallow trench isolation.

* * * * *